United States Patent

Oh et al.

[11] Patent Number: 5,977,553
[45] Date of Patent: Nov. 2, 1999

[54] MECHANISM FOR PREVENTING METALLIC ION CONTAMINATION OF A WAFER IN ION IMPLANTATION EQUIPMENT

[75] Inventors: Sang-guen Oh; Chang-eob Soh, both of Suwon, Rep. of Korea

[73] Assignee: Samsung Electronics Co., Ltd., Suwon, Rep. of Korea

[21] Appl. No.: 09/034,328

[22] Filed: Mar. 4, 1998

[30] Foreign Application Priority Data

Mar. 10, 1997 [KR] Rep. of Korea .................. 97-7993

[51] Int. Cl.⁶ ................................................. H01J 37/244
[52] U.S. Cl. .................... 250/492.21; 250/492.2; 250/398; 250/492.3
[58] Field of Search ................. 250/492.21, 492.2, 250/492.3, 423 R, 398

[56] References Cited

U.S. PATENT DOCUMENTS 5,293,508  3/1994  Shiratake et al. .................. 250/492.21
5,757,018  5/1998  Mack et al. ........................ 250/492.21

Primary Examiner—Edward P. Westin
Assistant Examiner—Nikita Wells
Attorney, Agent, or Firm—Jones Volentine, LLP

[57] ABSTRACT

When employing conventional ion implantation equipment, the peripheral edge of the wafer is contaminated by metallic ions generated from the collision of the accelerated ion beam with the disk that supports the target, namely a wafer. The present invention provides a magnet for forming a magnetic field which will repel the generated metallic ions. The magnet is disposed on the disk and surrounds the wafer to prevent the metallic ions from impinging the wafer.

4 Claims, 1 Drawing Sheet

MECHANISM FOR PREVENTING METALLIC ION CONTAMINATION OF A WAFER IN ION IMPLANTATION EQUIPMENT

BACKGROUND OF THE INVENTION

1. Field of the Invention

The present invention relates to preventing the contamination of a wafer in ion implantation equipment, and more particularly, to preventing the periphery of the wafer from being contaminated by metallic ions generated during an ion implantation process.

2. Description of the Related Art

In general, ion implantation in the manufacture of semiconductor devices refers to technology that injects ions into a given target. The ion implantation equipment supplies energy to the ions sufficient to accelerate the ions to such a degree that they can penetrate the target surface.

In conventional ion implantation equipment, the concentration of impurities is controlled within a limit ranging from $10^{14}$ to $10^{18}$ atoms/cm$^3$. Such equipment is widely used for implanting ions into a given target material, because it controls the concentration of impurities better than other impurity implantation techniques.

Ion implantation equipment generally includes at least the following components: vacuum loadlock, ion source, beam extracting and accelerating device, mass analyzer, accelerator tube, and a disk for mounting a target thereon. The equipment is designed to produce varying levels of high voltage to effect ion decomposition, extraction, and acceleration. During the ion implantation process the ion gas supplied from the ion source is turned into plasma and the ions are accelerated and extracted by an electric field formed by the applied voltage. The extracted ions form an ion beam. The amount and size of the ions are analyzed at a point where the ion beam is diffracted, and the ion beam is then accelerated sufficiently to penetrate the target to an intended depth.

The above-described conventional ion implantation equipment generally has a structure as shown in FIG. 1, and comprises an ion source 12, an ion extracting and accelerating device 14, a mass analyzer 16, an accelerator tube 18, a tandem electron chamber 20, and a disk 22 disposed in a path along which the generated ion beam propagates toward the wafer 10. In addition, a Faraday cup assembly 24 is provided to neutralize the environment in which the ions are injected into the wafer 10, and to measure the doping dose.

The ion source 12 supplies the source gas to the ion extracting and accelerating device 14. Positive ions are generated and extracted by the beam extracting and accelerating device 14 so as to form an ion beam 17, and the resultant ion beam 17 is diffracted and analyzed in the mass analyzer 16.

The ion beam 17 is accelerated in the accelerator tube 18 and tandem electron chamber 20, and then injected into the wafer 10 held on the disk 22. The amount of the ions injected into the wafer 10 is measured by the current meter 28 of the Faraday cup assembly 24.

When the ion beam 17 finally reaches the wafer 10 and the disk 22, the positive ions collide therewith beneath the wafer surface. The injected positive ions act as impurities inside the wafer 10. The reverse bias power source 26, integrated with the Faraday cup assembly, is used to constrain the movement of secondary electrons given off the target wafer when irradiated with the ion beam 17.

When the positive ions collide with one another in the disk 22, metallic ions are scattered from the disk 22. As a result, the wafer periphery is contaminated by the metallic ions as shown by the arrows in FIG. 1. The contaminants are mostly heavy metals, such as iron and aluminum. The contaminants at the wafer periphery adversely affect the semiconductor manufacturing process, thereby reducing the production yield.

The above problem occurs more often in ion implantation equipment wherein the ion implantation is conducted at an energy level higher than 300 keV, namely in connection with the so-called Deep Process.

The amount of the heavy metal contaminating the wafer periphery is proportional to the accelerating energy of the ion beam and the beam current. Accordingly, it is a generally accepted practice to reduce the accelerating energy of the ion beam and the beam current in order to prevent the heavy metal contamination of the wafer when using conventional ion implantation equipment.

However, because the accelerating energy of the ion beam is an important factor in the Projected Range (PR) or depth of implantation, there is a limit to how much the accelerating energy can be reduced in order to, in turn, limit the metal contamination.

Although a reduction of the beam current reduces the amount of the contaminants, this results in the reduction of the number of wafer-injected ions, and an increase in the time necessary to process a wafer. Accordingly, reducing the beam current results in a corresponding decrease in the manufacturing productivity.

SUMMARY OF THE INVENTION

An object of the present invention is to provide a mechanism for preventing the contamination of a wafer in ion implantation equipment, wherein an ion beam, which is accelerated and propagates with high energy, collides with the disk of the equipment and generates metallic ions which are potential contaminants of the wafer periphery.

To achieve this and other objects and advantages, the present invention provides ion implantation equipment including means for forming a magnetic field which repels the metallic ions, generated by the collision of the ions with the disk, from the peripheral edge of the wafer mounted on the disk.

In addition, the means for forming the magnetic field may comprise a bar magnet, and is particularly effective in equipment producing an accelerating energy higher than 300 keV.

BRIEF DESCRIPTION OF THE DRAWINGS

The accompanying drawings illustrate an embodiment of the invention, in which.

DETAILED DESCRIPTION OF THE PREFERRED EMBODIMENTS

Reference will now be made in detail to the preferred embodiment of the present invention, an example of which is illustrated in the accompanying drawings.

Figure 1:
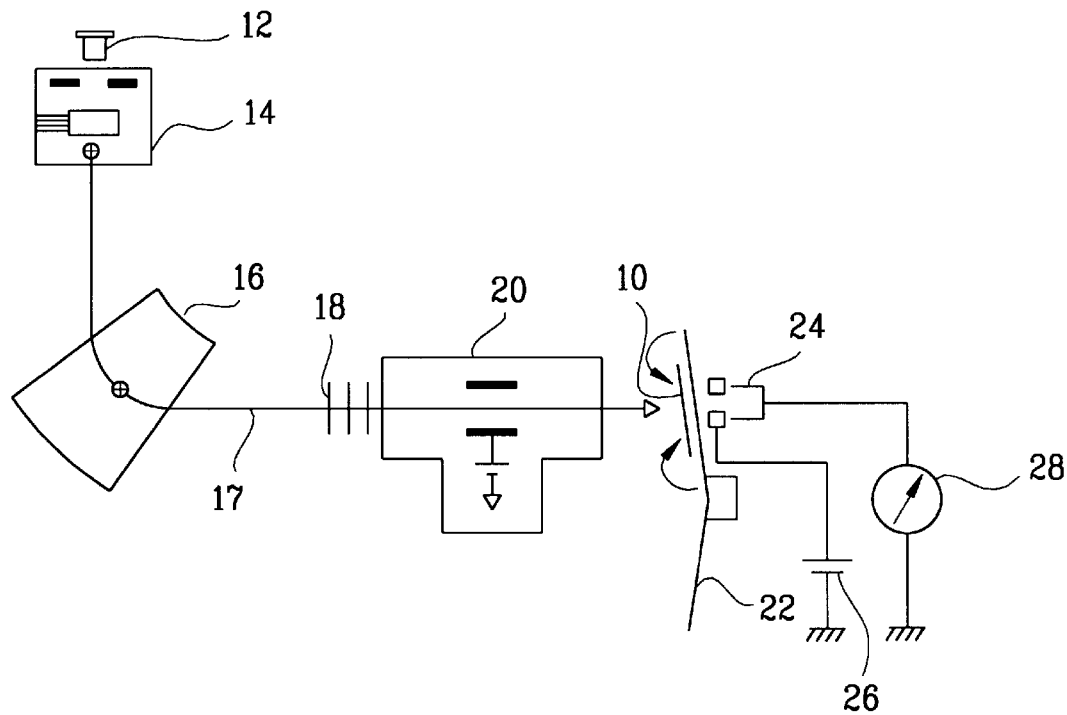
FIG. 1 is a schematic diagram of conventional ion implantation equipment.
Figure 2:
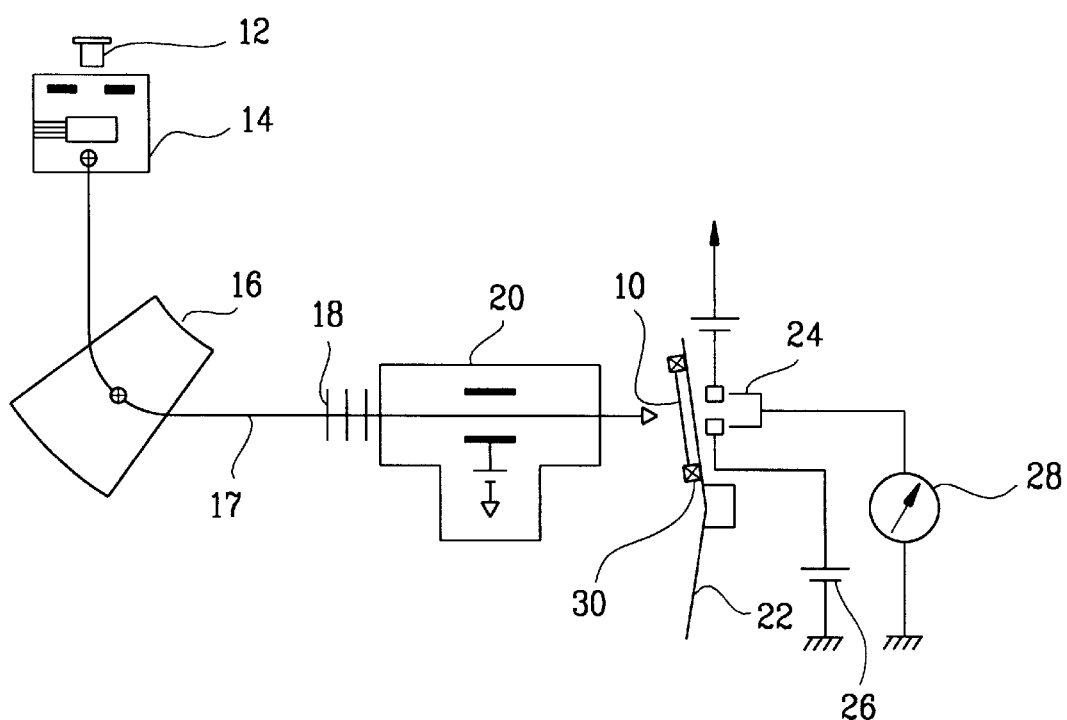
FIG. 2 is a schematic diagram of an embodiment of the ion implantation equipment for preventing metallic ion contamination of a wafer according to the present invention.

FIG. 2 shows an embodiment of the apparatus for preventing metallic ion contamination of a wafer according to the present invention. The parts of the apparatus which are similar to that of the apparatus shown in FIG. 2 are designated by like reference numerals, and a detailed description thereof is omitted.

Referring now to FIG. 2, an ion source 12, ion extracting and accelerating device 14, mass analyzer 16, accelerator tube 18, tandem electron chamber 20, and disk 22 are disposed in a path along which an ion beam 17 is generated and injected. A Faraday cup assembly 24 is provided to neutralize the environment in which the ions are injected into the wafer 10, and to measure its doping dose. In addition, a power source 26 for applying a reverse bias, and a current meter 28 for displaying the amount of the injected ions, are integrated with the Faraday cup assembly 24.

Further, a magnet 30 is installed on the disk 22 on which a wafer is loaded. The magnet 30 is in the shape of a ring and its polarity is oriented such that the repelling force is directed outward. After the magnet 30 is installed on the disk 22, the wafer 10 is placed inside the magnet 30 on the disk 22.

Ions generated from the ion source 12, and accelerated with a certain accelerating energy, irradiate the wafer 10 and the disk 22. Consequently, secondary ions are generated from the wafer 10, and metallic ions are generated from the disk 22.

The secondary ions generated from the wafer 10 are usually constrained by the voltage that is reverse-biased by the high voltage power source 26.

The metallic ions emitted from the disk 22 are constrained by the reverse-biased high voltage and the magnetic field of the magnet 30, thereby being prevented from approaching the wafer 10.

The heavy metallic ions generated from the disk 22, such as Fe or Al, are electrically negative. The magnet 30 is oriented with its negative pole facing outward and its positive pole facing the disk 22. Therefore, the outside surface of the magnet 30 repels the metallic ions, such as Fe or Al, away from the wafer 10. Accordingly, metallic ions of Fe, Al or any other heavy metal are prevented from contaminating the wafer periphery.

The embodiment of the present invention is particularly effective in the so-called Deep Process, wherein the ions are injected deeply into the wafer with a high accelerating energy of over 300 keV. At this energy level, a large amount of the metallic ions are generated, corresponding to the high accelerating energy and beam current.

Although the present invention has been described in detail, it should be understood that various changes, substitutions and alterations can be made thereto without departing from the spirit and scope of the invention as defined by the appended claims.

What is claimed is:

1. Ion implantation equipment for implanting ions into a target, said equipment comprising:

an ion source;

a metallic disk for supporting the target;

means for accelerating an ion beam at a designated energy level, the ion beam being produced from ions generated by said ion source, toward said target and said metallic disk; and metallic ion repelling means for repelling metallic ions, produced by the collision of the ion beam with said metallic disk, away from the target.

2. The equipment as claimed in claim 1, wherein said metallic ion repelling means is a magnet.

3. The equipment as claimed in claim 2, wherein said magnet is annular and is mounted to said disk, and wherein said target is disposed within said annular magnet.

4. The equipment as claimed in claim 1, wherein said designated energy level is greater than 300 keV.

* * * * *